(12) United States Patent
Takahashi et al.

(10) Patent No.: US 9,750,136 B2
(45) Date of Patent: Aug. 29, 2017

(54) WIRING BOARD AND METHOD FOR MANUFACTURING THE SAME

(71) Applicant: IBIDEN CO., LTD., Ogaki (JP)

(72) Inventors: Michimasa Takahashi, Ogaki (JP); Katsutoshi Kitagawa, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/375,297

(22) Filed: Dec. 12, 2016

(65) Prior Publication Data

US 2017/0171974 A1  Jun. 15, 2017

(30) Foreign Application Priority Data

Dec. 11, 2015  (JP) .................................. 2015-241764

(51) Int. Cl.
| | |
|---|---|
| H05K 1/16 | (2006.01) |
| H05K 1/11 | (2006.01) |
| H05K 3/00 | (2006.01) |
| H05K 3/40 | (2006.01) |
| H05K 3/46 | (2006.01) |
| H05K 3/42 | (2006.01) |
| H05K 1/09 | (2006.01) |

(52) U.S. Cl.
CPC .............. *H05K 1/115* (2013.01); *H05K 1/09* (2013.01); *H05K 3/0011* (2013.01); *H05K 3/4007* (2013.01); *H05K 3/429* (2013.01); *H05K 3/4644* (2013.01); *H05K 2201/095* (2013.01)

(58) Field of Classification Search
CPC .... H05K 1/115; H05K 3/0011; H05K 3/4007; H05K 3/4644; H05K 3/429; H05K 1/09; H05K 2201/095

USPC .......................................... 174/260, 262, 267
See application file for complete search history.

(56) References Cited

U.S. PATENT DOCUMENTS

| | | | |
|---|---|---|---|
| 2005/0173809 A1* | 8/2005 | Yamamoto | H01L 21/56 257/780 |
| 2008/0094813 A1* | 4/2008 | Hsu | H05K 1/116 361/765 |
| 2013/0161085 A1* | 6/2013 | Oh | H01L 24/11 174/267 |
| 2015/0156883 A1* | 6/2015 | Bong | H05K 3/4007 174/266 |
| 2015/0382468 A1* | 12/2015 | Lin | H01L 23/3677 361/767 |
| 2017/0064835 A1* | 3/2017 | Ishihara | H05K 1/183 |

FOREIGN PATENT DOCUMENTS

JP  2011-187477 A  9/2011

* cited by examiner

*Primary Examiner* — Sherman Ng
(74) *Attorney, Agent, or Firm* — Oblon, McClelland, Maier & Neustadt, L.L.P.

(57) ABSTRACT

A wiring board includes an insulating substrate, a first conductor layer laminated on a first side of the insulating substrate, a second conductor layer laminated on a second side of the insulating substrate, first plating posts fitted in through holes in the insulating substrate respectively such that the first plating posts are projecting from the first conductor layer, and plating connecting parts connecting the second conductor layer and the first plating posts and having electronic component connecting portions such that the electronic component connecting portions form an electronic component mounting part positioned to mount an electronic component and are positioned on the through holes, respectively.

20 Claims, 13 Drawing Sheets

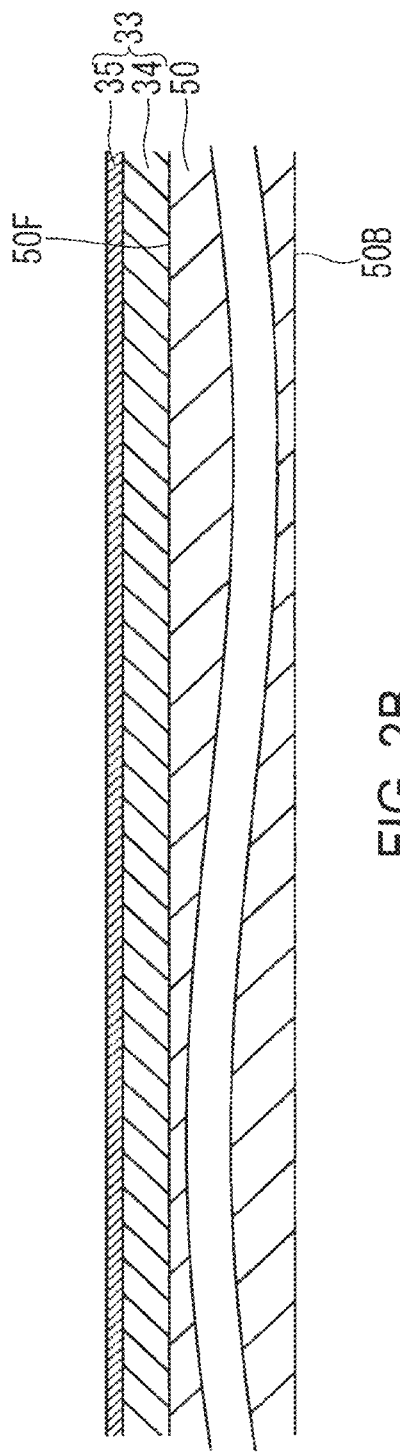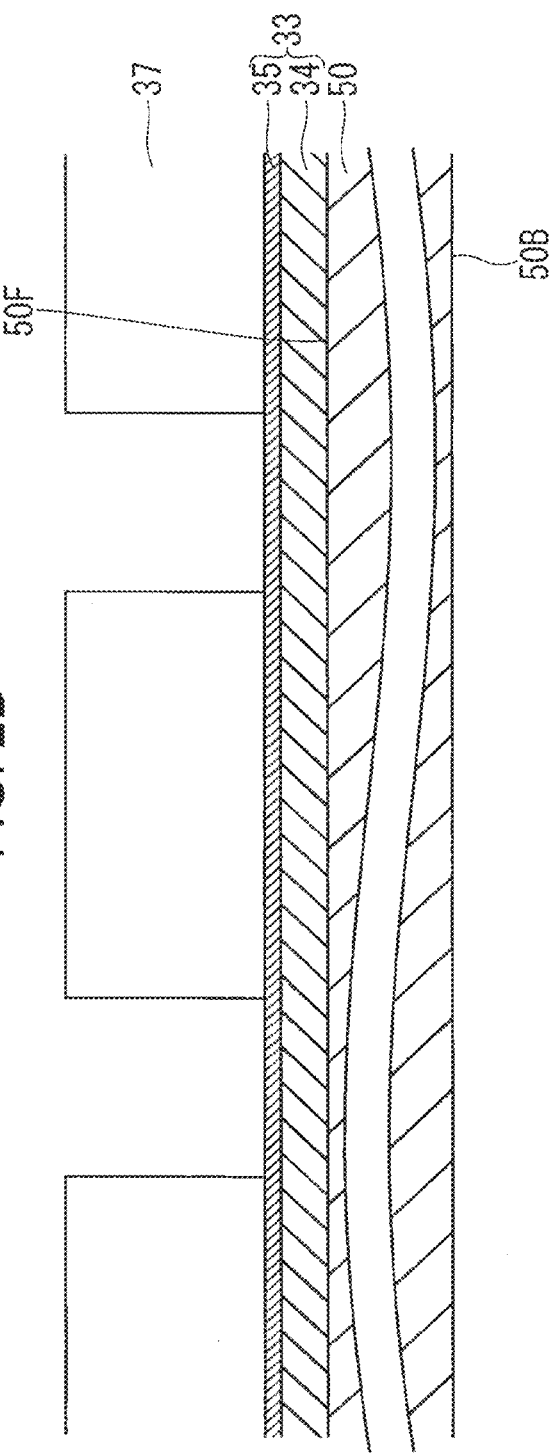

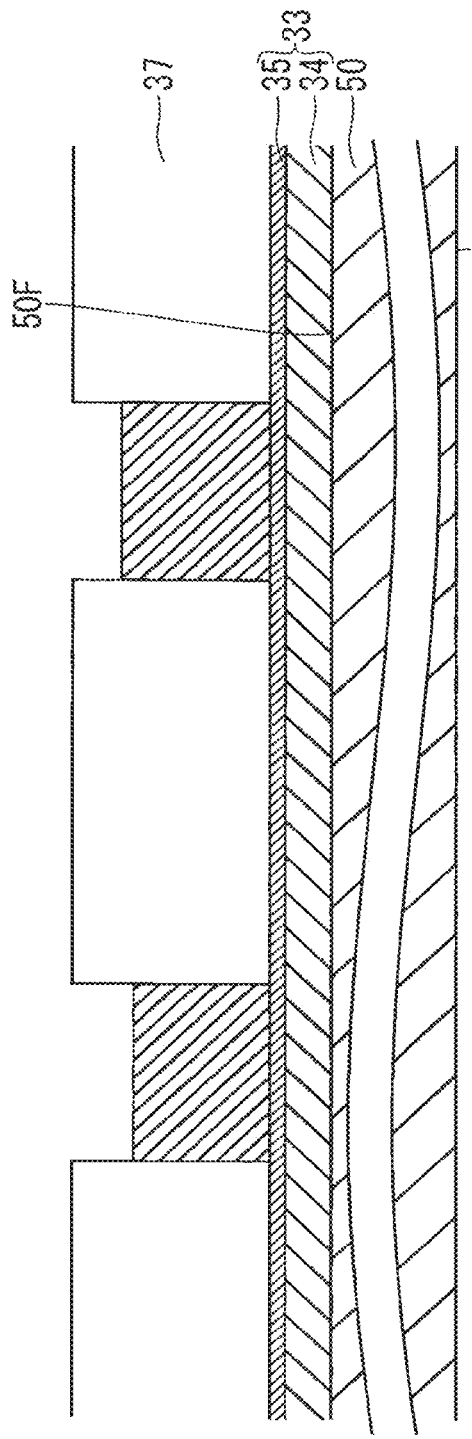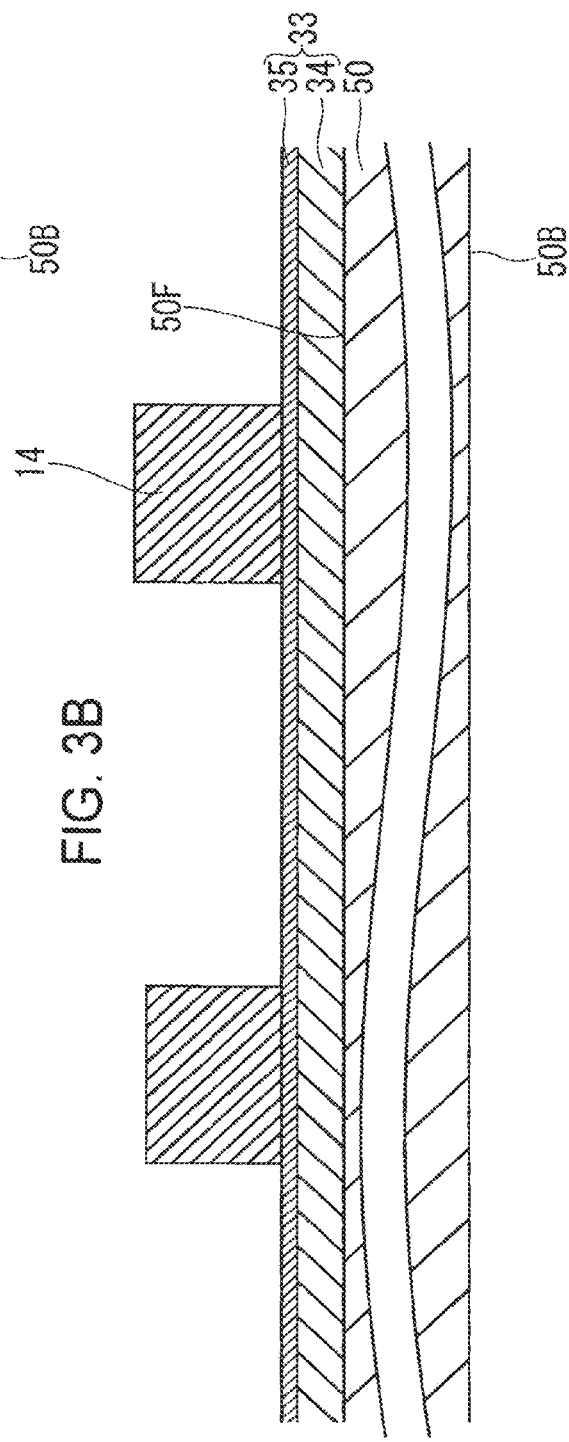

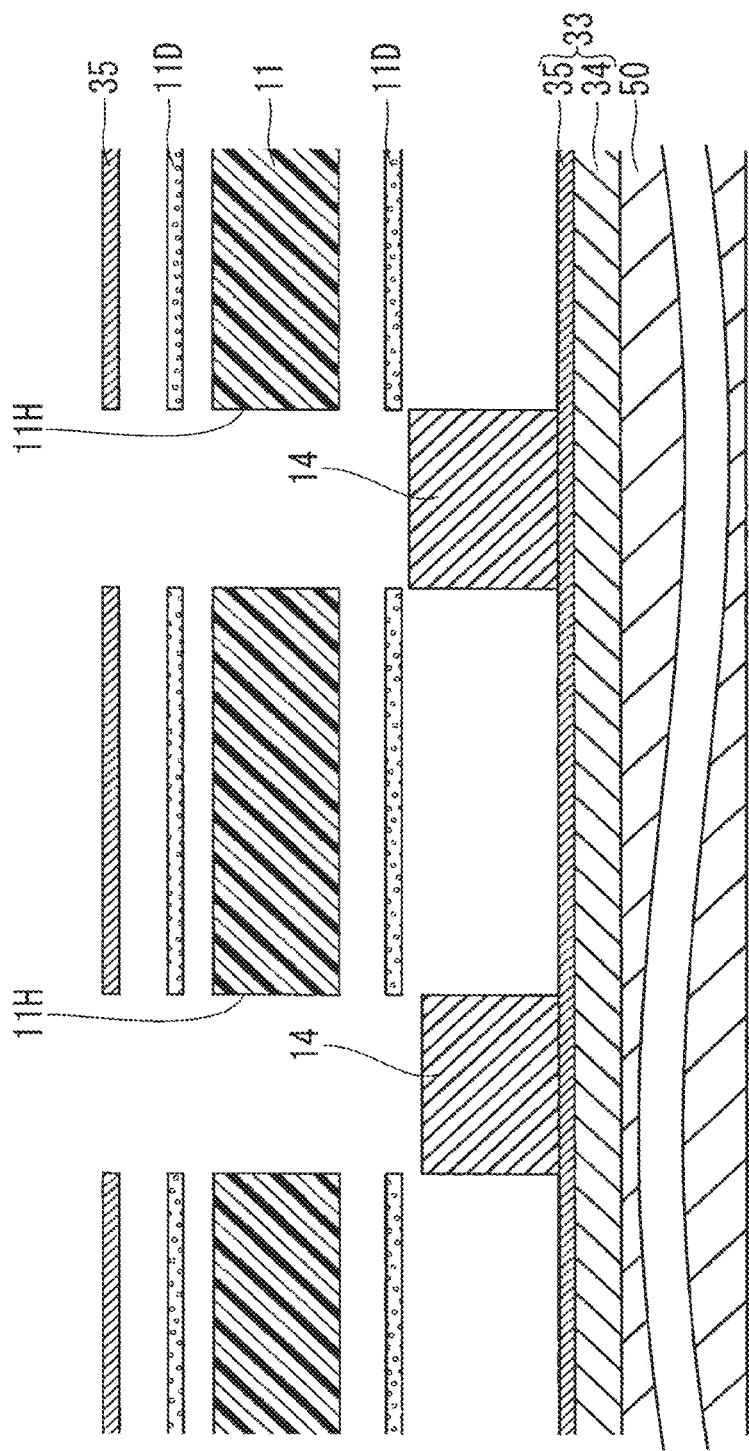

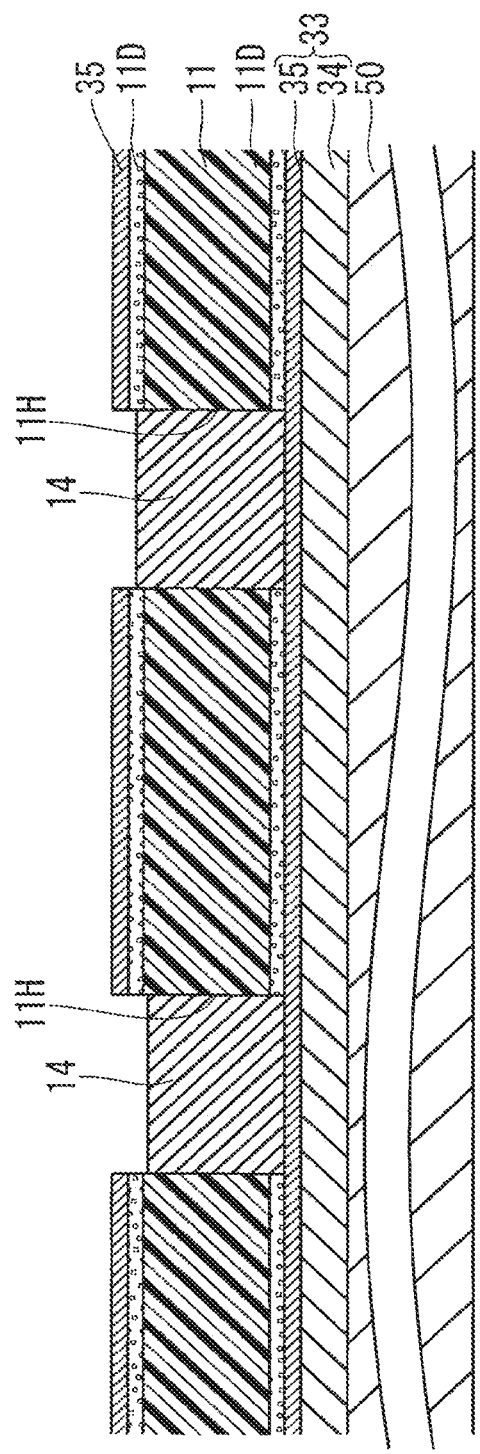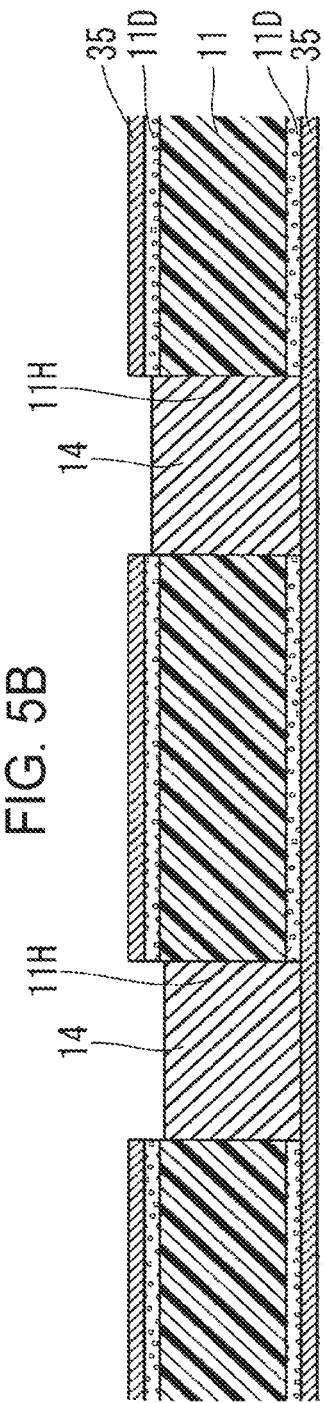

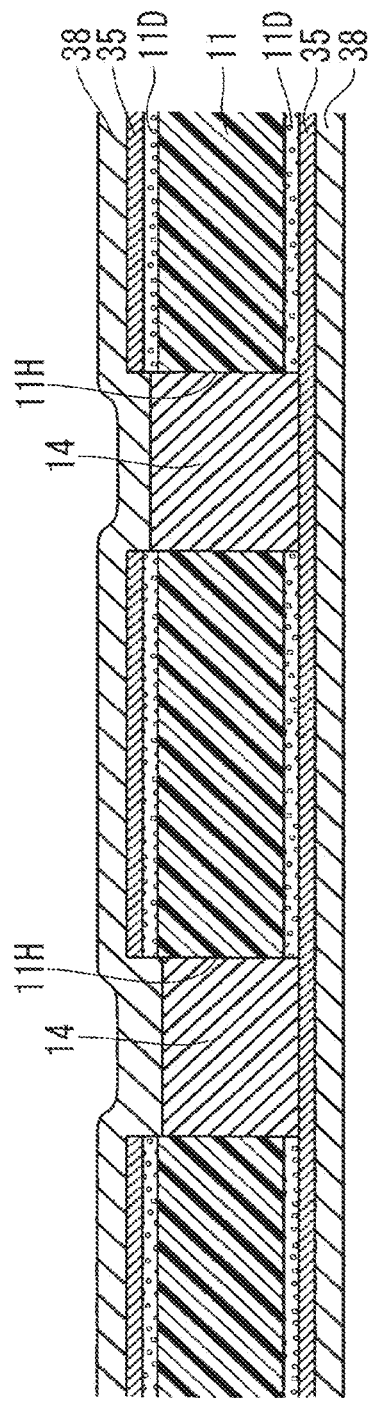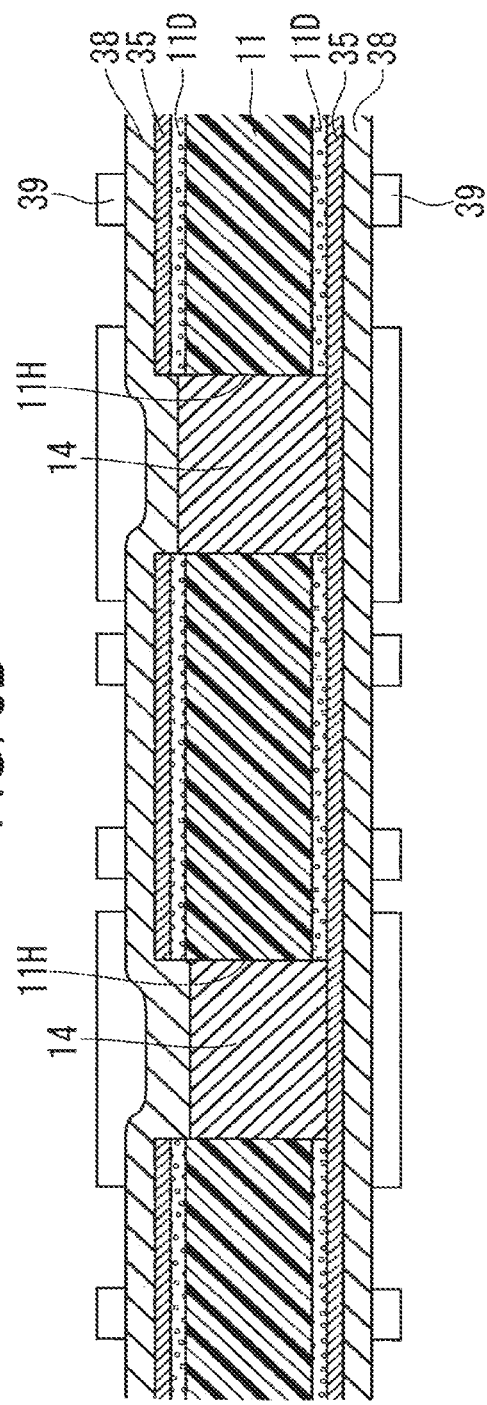

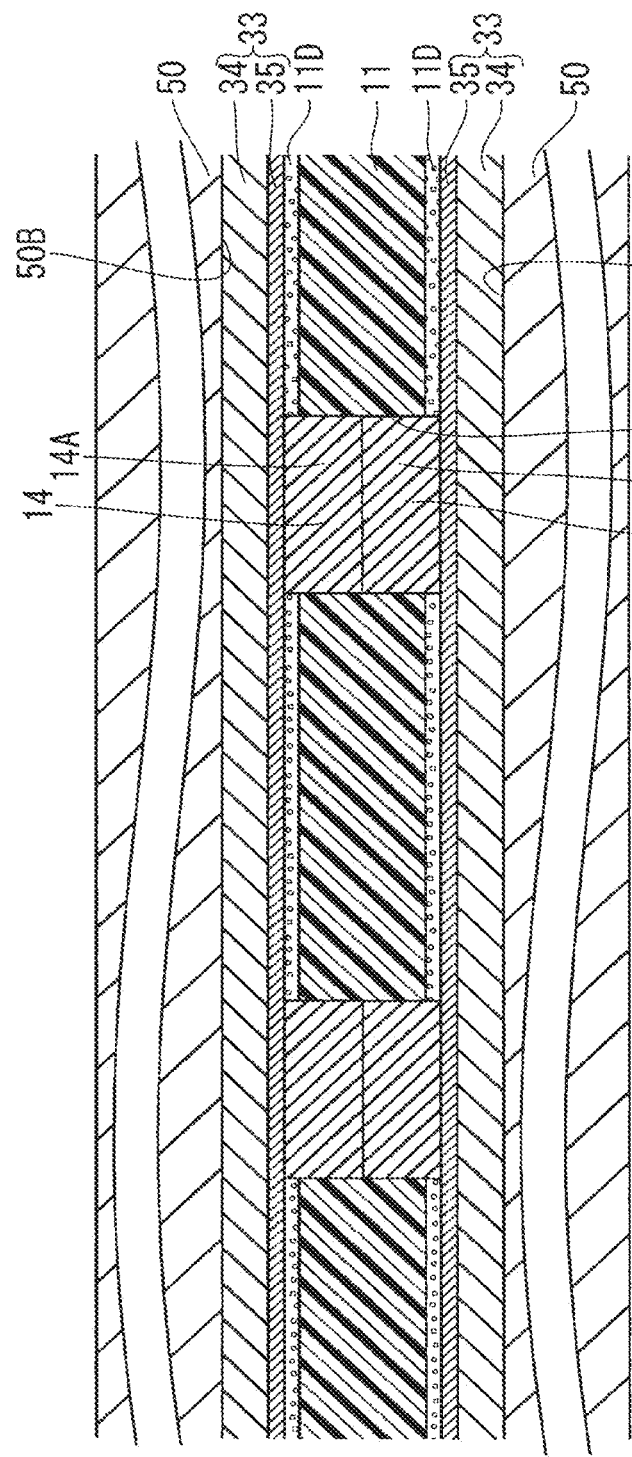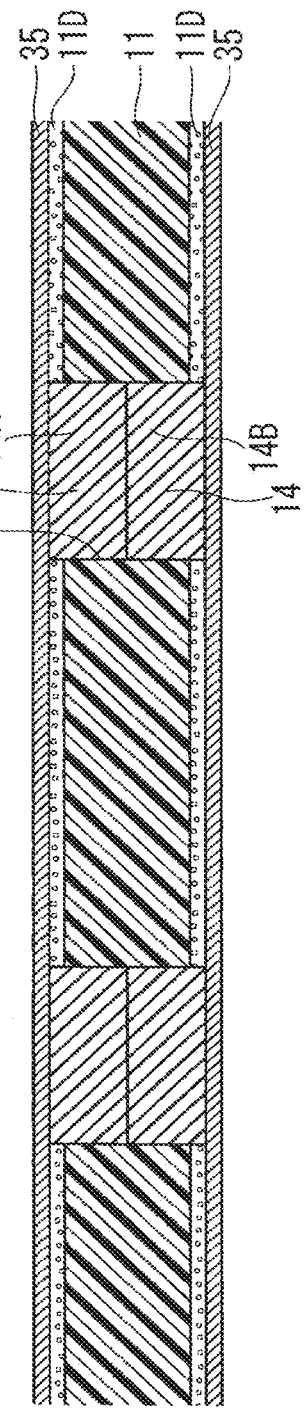

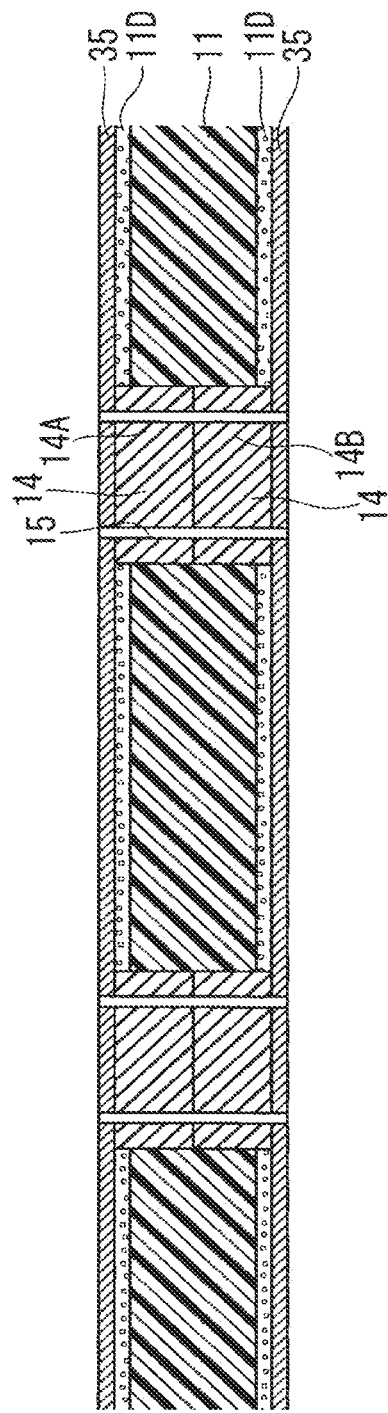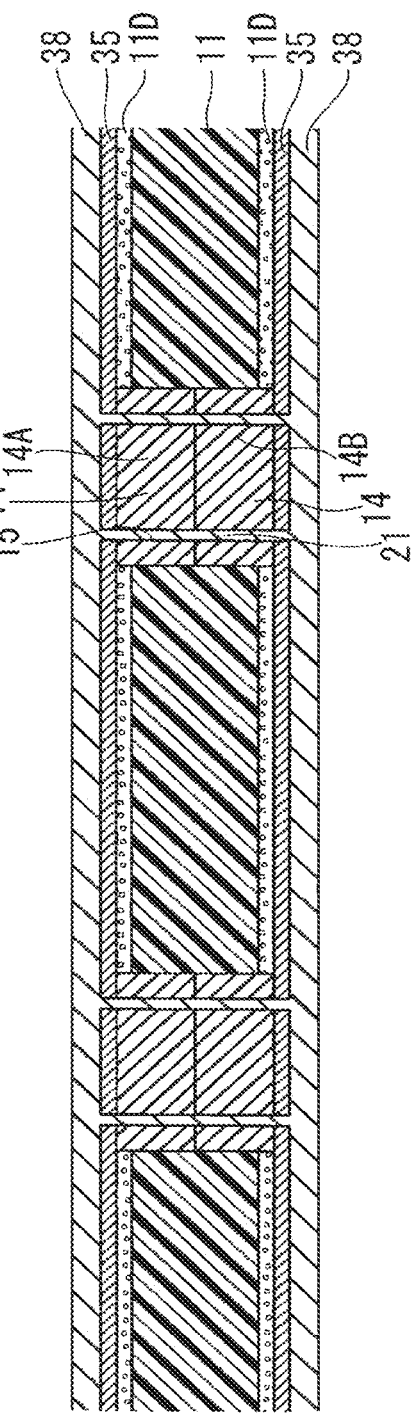

WIRING BOARD AND METHOD FOR MANUFACTURING THE SAME

CROSS-REFERENCE TO RELATED APPLICATIONS

The present application is based upon and claims the benefit of priority to Japanese Patent Application No. 2015-241764, filed Dec. 11, 2015, the entire contents of which are incorporated herein by reference.

BACKGROUND OF THE INVENTION

Field of the Invention

The present invention relates to a wiring board in which a conductor layer is laminated on both front and back sides of an insulating substrate, and relates to a method for manufacturing the wiring board.

Description of Background Art

A wiring board may have metal members that connect to electronic component mounting parts of a conductor layer are accommodated in through holes of an insulating substrate (for example, see Japanese Patent Laid-Open Publication No. 2011-187477). The entire contents of this publication are incorporated herein by reference.

SUMMARY OF THE INVENTION

According to one aspect of the present invention, a wiring board includes an insulating substrate, a first conductor layer laminated on a first side of the insulating substrate, a second conductor layer laminated on a second side of the insulating substrate, first plating posts fitted in through holes in the insulating substrate respectively such that the first plating posts are projecting from the first conductor layer, and plating connecting parts connecting the second conductor layer and the first plating posts and having electronic component connecting portions such that the electronic component connecting portions form an electronic component mounting part positioned to mount an electronic component and are positioned on the through holes, respectively.

According to another aspect of the present invention, a method for manufacturing a wiring board includes forming through holes in an insulating substrate, forming first plating posts on a metal foil such that the first plating posts are projecting from the metal foil, laminating the metal foil on a first side of the insulating substrate such that the first plating posts are fitted and accommodated in the through holes in the insulating substrate respectively, and forming a first conductor layer including the metal foil such that the first conductor layer is formed on the first side of the insulating substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2A and 2B are cross-sectional side views illustrating manufacturing processes of the wiring board;

FIGS. 3A and 3B are cross-sectional side views illustrating manufacturing processes of the wiring board;

FIG. 4 is a cross-sectional side view illustrating a manufacturing process of the wiring board;

FIGS. 5A and 5B are cross-sectional side views illustrating manufacturing processes of the wiring board;

FIGS. 6A and 6B are cross-sectional side views illustrating manufacturing processes of the wiring board;

FIGS. 10A and 10B are cross-sectional side views illustrating manufacturing processes of the wiring board;

FIGS. 11A and 11B are cross-sectional side views illustrating manufacturing processes of the wiring board;

DETAILED DESCRIPTION OF THE EMBODIMENTS

Figure 1:
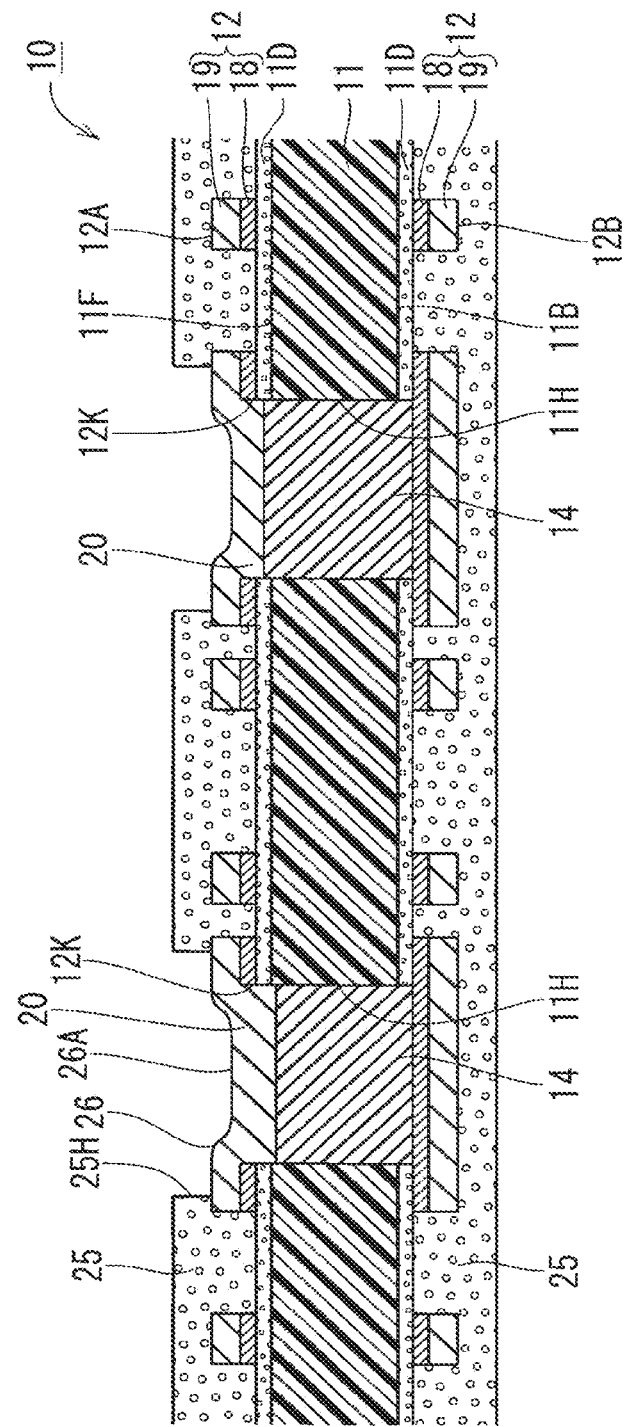
FIG. 1 is a cross-sectional side view of a wiring board according to a first embodiment of the present invention.

The embodiments will now be described with reference to the accompanying drawings, wherein like reference numerals designate corresponding or identical elements throughout the various drawings.

First Embodiment

In the following, a first embodiment of the present invention is described with reference to FIG. 1-8. As illustrated in FIG. 1, in a wiring board 10 of the present embodiment, conductor layers (12, 12) are respectively formed on front and back surfaces of an insulating substrate 11 (corresponding to a "substrate" of the present invention) that is formed from an insulating member and has plasticity. Among the conductor layers (12, 12), the conductor layer 12 on an F surface (11F) side, which is a front surface side of the insulating substrate 11, corresponds to a second conductor layer (12A) of the present invention, and the conductor layer 12 on a B surface (11B) side, which is a back surface side of the insulating substrate 11, corresponds to a first conductor layer (12B) of the present invention.

The conductor layers (12, 12) each include a copper foil layer 18 (corresponding to a "metal foil layer" of the present invention) that is provided on the insulating substrate 11 and a copper plating layer 19 (corresponding to a "metal plating layer" of the present invention) that is formed on the copper foil layer 18. Coverlays (25, 25) are respectively laminated on the front and back conductor layers (12, 12). Further, multiple pad holes (25H) are formed in the coverlay 25 on the F surface (11F) side of the insulating substrate 11. Portions of the conductor layer 12 that are exposed from the pad holes (25H) become pads 26 (corresponding to "electronic component connecting parts" of the present invention). The insulating substrate 11 and each of the conductor layers (12, 12) are bonded by a bonding sheet (11D). Hereinafter, the term "insulating substrate 11" means a substrate that includes the insulating substrate 11 and the bonding sheets (11D).

Here, in the wiring board 10 of the present embodiment, multiple insulating through holes (11H) (corresponding to "through holes" of the present invention) are provided in the insulating substrate 11. Then, for example, copper plating posts 14 are fitted in the insulating through holes (11H) without leaving any gaps. The plating posts 14 protrude from the copper foil layer 18 of the first conductor layer (12B). Front end surfaces of the plating posts 14 are respectively positioned inside the insulating through holes (11H). Further, there is a slight variation in height between the plating posts 14. In FIG. 1, a plating post 14 on a right side is slightly higher than a plating post 14 on a left side.

Second conductor through holes (12K) (corresponding to "through holes" of the present invention) that overlap with the insulating through holes (11H) of the insulating substrate 11 are provided in the second conductor layer (12A). Portions of interiors of the insulating through holes (11H) above the plating posts 14 and interiors of the second conductor through holes (12K) are subjected to copper plating, and plating connecting parts 20 that respectively connect to the plating posts 14 are formed. The plating connecting parts 20 are integrally formed with the copper plating layer 19 of the second conductor layer (12A). The plating posts 14 and the second conductor layer (12A) are connected by the plating connecting parts 20, and the front and back conductor layers 12, 12 are connected by the plating connecting parts 20 and the plating posts 14. The above-described pads 26 are respectively arranged in regions above the second conductor through holes (12K), and are each formed from a portion of the conductor layer 12 that is exposed from a pad hole (25H) and a portion of a plating connecting part 20 that is exposed from the pad hole (25H). An upper surface of a portion of a plating connecting part 20 that is exposed from a pad hole (25H) is lower than an upper surface of a portion of the conductor layer 12 that is exposed from the pad hole (25H). Thereby, a recess (26A) is formed in each of the pads 26.

The wiring board 10 of the present embodiment is manufactured as follows.

(1) As illustrated in FIG. 2A, a carrier-attached copper foil 33 is superposed on an F surface (50F), which is a front surface of a support substrate 50. The carrier-attached copper foil 33 is formed by superposing a carrier 34 and a copper foil 35 that becomes the copper foil layer 18 of the first conductor layer (12B), and by bonding outer peripheral portions of the carrier 34 and the copper foil 35 to each other. The carrier-attached copper foil 33 is arranged with the carrier 34 facing the F surface (50F) side.

(2) As illustrated in FIG. 2B, a plating resist 37 is formed on the copper foil 35.

(3) An electrolytic plating treatment is performed. As illustrated in FIG. 3A, copper plating is filled in portions of the copper foil 35 that are exposed from the plating resist 37.

(4) The plating resist 37 is peeled off. As illustrated in FIG. 3B, the plating posts 14 are formed on the copper foil 35. Variation in height between the plating posts 14 occurs.

(5) The flexile insulating substrate 11 that is made of a polyimide resin, the two bonding sheets (11D, 11D), and a copper foil 35 that becomes the copper foil layer 18 of the second conductor layer (12A) are prepared. The insulating through holes (11H) are provided in the insulating substrate 11, and through holes that overlap with the insulating through holes (11H) are also provided in the bonding sheets (11D, 11D) and the copper foil 35. Then, as illustrated in FIG. 4, the bonding sheet (11D), the insulating substrate 11, the bonding sheet (11D) and the copper foil 35 are stacked in this order from the carrier-attached copper foil 33 side on the carrier-attached copper foil 33.

(6) A hot pressing treatment is performed. As illustrated in FIG. 5A, the support substrate 50, the carrier-attached copper foil 33, the insulating substrate 11 and the copper foil 35 are integrated. As a result, the copper foils 35 are bonded to the front and back sides of the insulating substrate 11, and the plating posts 14 are press-fitted into the insulating through holes (11H) of the insulating substrate 11 without leaving any gaps.

(7) As illustrated in FIG. 5B, the support substrate 50 and the carrier 34 are peeled off.

(8) An electroless plating treatment is performed. An electroless plating film (not illustrated in the drawings) is formed on the copper foils (35, 35) of the F surface (11F) side and the B surface (11B) side, on upper surfaces of the plating posts 14, and in the through holes (second conductor through holes (12K)) of the copper foil 35 of the F surface (11F) side.

(9) An electrolytic plating treatment is performed. As illustrated in FIG. 6A, a copper plating film 38 (corresponding to a "metal plating film" of the present invention) is formed on the electroless plating film (not illustrated in the drawings). As a result, copper plating is performed on the copper foils (35, 35), and the second conductor through holes (12K) are filled with copper plating.

(10) As illustrated in FIG. 6B, an etching resist 39 is formed on each of the copper plating films 38.

Figure 7A:
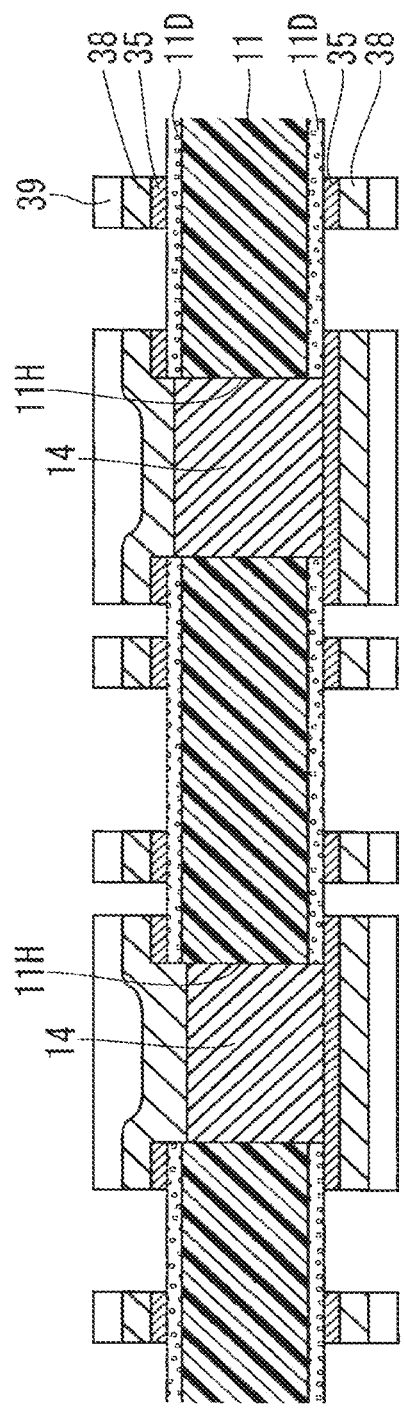
FIGS. 7A and 7B are cross-sectional side views illustrating manufacturing processes of the wiring board.

(11) Etching is performed. As illustrated in FIG. 7A, portions of the copper plating films 38, the electroless plating films and the copper foils 35 that are exposed from the etching resists 39 are removed.

Figure 7B:
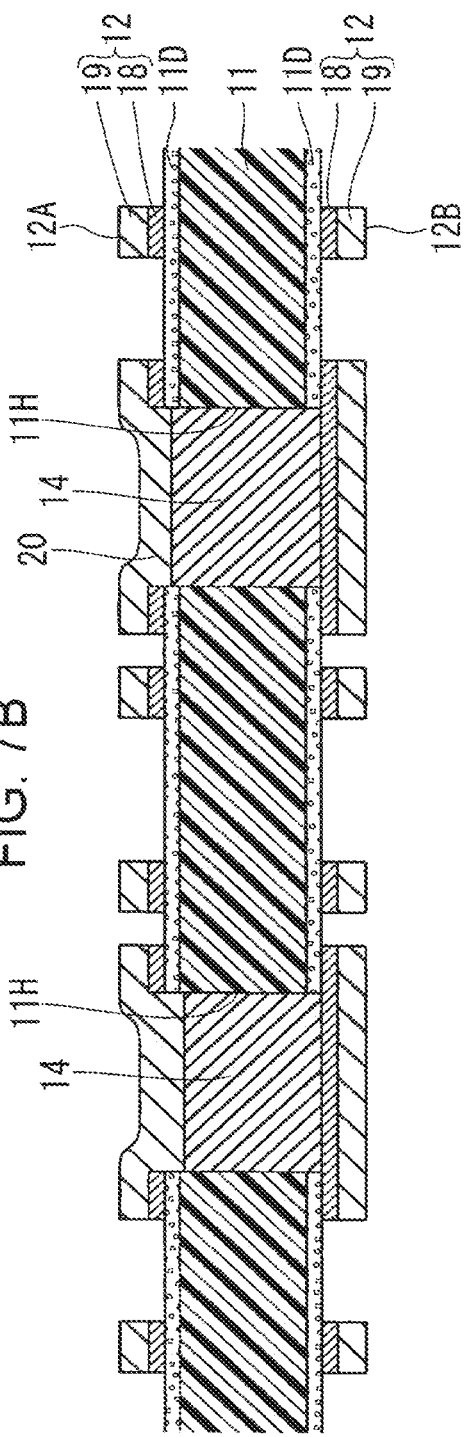

(12) The etching resists 39 are peeled off. As illustrated in FIG. 7B, from the remaining copper foils 35, electroless plating films and copper plating films 38, the conductor layers 12 that each have the copper foil layer 18 and the copper plating layer 19 are formed, and the plating connecting parts 20 that connect the second conductor layer (12A) on the F surface (11F) side and the plating posts 14 are formed by the copper plating filled in the second conductor through holes (12K).

(13) The coverlays (25, 25) are respectively laminated on the conductor layers (12, 12) of the front and back sides of the insulating substrate 11. The pad holes (25H) are formed in advance in the coverlay 25 of the F surface (11F) side, and portions of the second conductor layer (12A) and the plating connecting parts 20 that are exposed from the pad holes (25H) become the pads 26. As a result, the wiring board 10 illustrated in FIG. 1 is completed.

Figure 8:
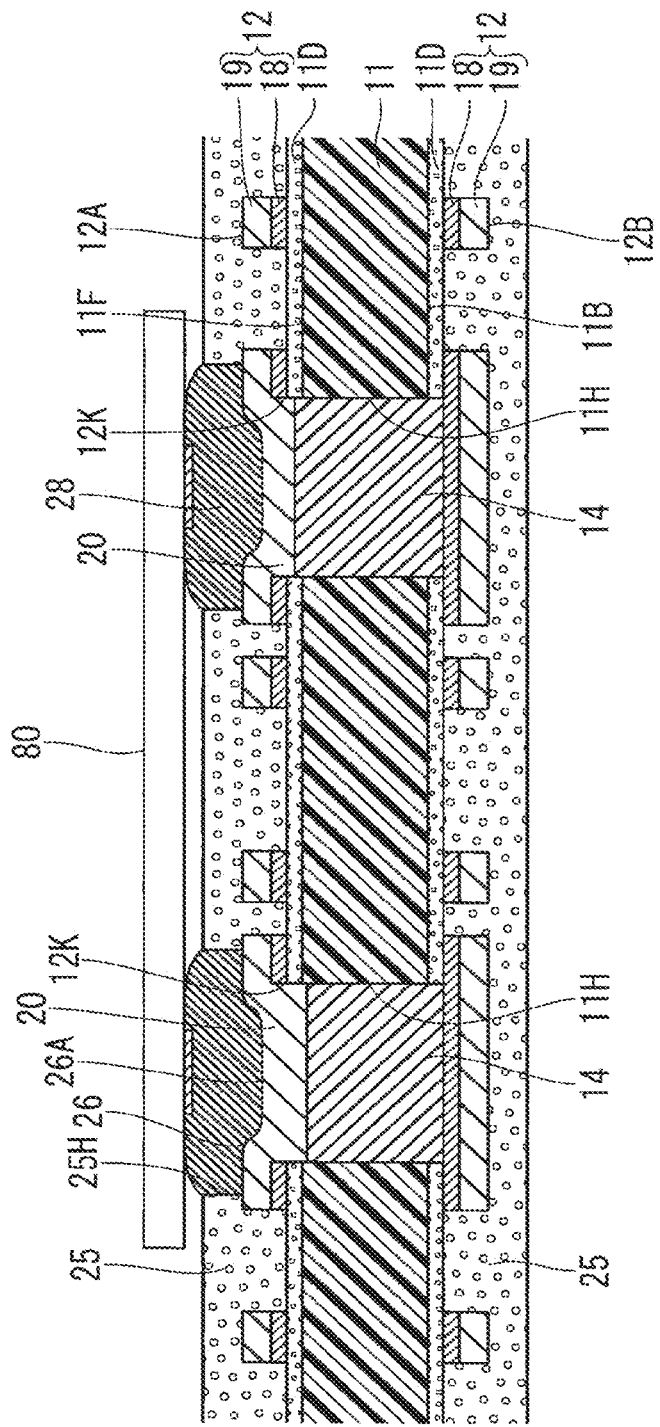
FIG. 8 is a cross-sectional side views illustrating an example of use of the wiring board.

Description about the structure and the manufacturing method of the wiring board 10 of the present embodiment is as given above. Next, an example of use and an operation effect of the wiring board 10 are described. The wiring board 10 of the present embodiment, for example, as illustrated in FIG. 8, is used by forming solder bumps 28 on the pads 26 and mounting and soldering an LED 80 or the like on the solder bumps 28. An electronic component mounting part 29 of the present invention is formed from the two pads (26, 26) that are connected to the LED 80.

In the wiring board 10 of the present embodiment, the plating posts 14 are fitted into the insulating substrate 11 and are connected to the LED 80 via the plating connecting parts 20, and thus, heat from the LED 80 is efficiently released and occurrence of a problem in the LED 80 is prevented. Further, two plating posts (14, 14) are connected to one LED 80 (that is, two plating posts (14, 14) are connected to one electronic component mounting part 29). Therefore, heat from the LED 80 can be more efficiently released.

However, in a wiring board, fitting the metal members for heat dissipation was performed using a mold. For example, when several types of metal members having different sizes are prototyped, a mold is prepared each time the metal members are prototyped and thus there may be a problem that the cost is increased.

In contrast, in the wiring board 10 of the present embodiment, the plating posts 14 are formed by performing copper plating on the copper foil 35, and are fitted into the insulating through holes (11H) of the insulating substrate 11 by laminating the copper foil 35 on the insulating substrate 11. Therefore, it is not necessary to prepare a mold to match desired metal members and thus, cost can be reduced. Further, the plating posts 14 are formed on the copper foil 35. Therefore, the multiple plating posts 14 can be formed at once, and fitting the plating posts 14 into the insulating substrate 11 can also be performed at once. Further, the plating posts 14 are positioned on the copper foil 35 which becomes the copper foil layer 18 of the first conductor layer (12B) at the same time the plating posts 14 are formed. Therefore, the plating posts 14 can be smoothly press-fitted into the insulating through holes (11H).

Second Embodiment

Figure 9:
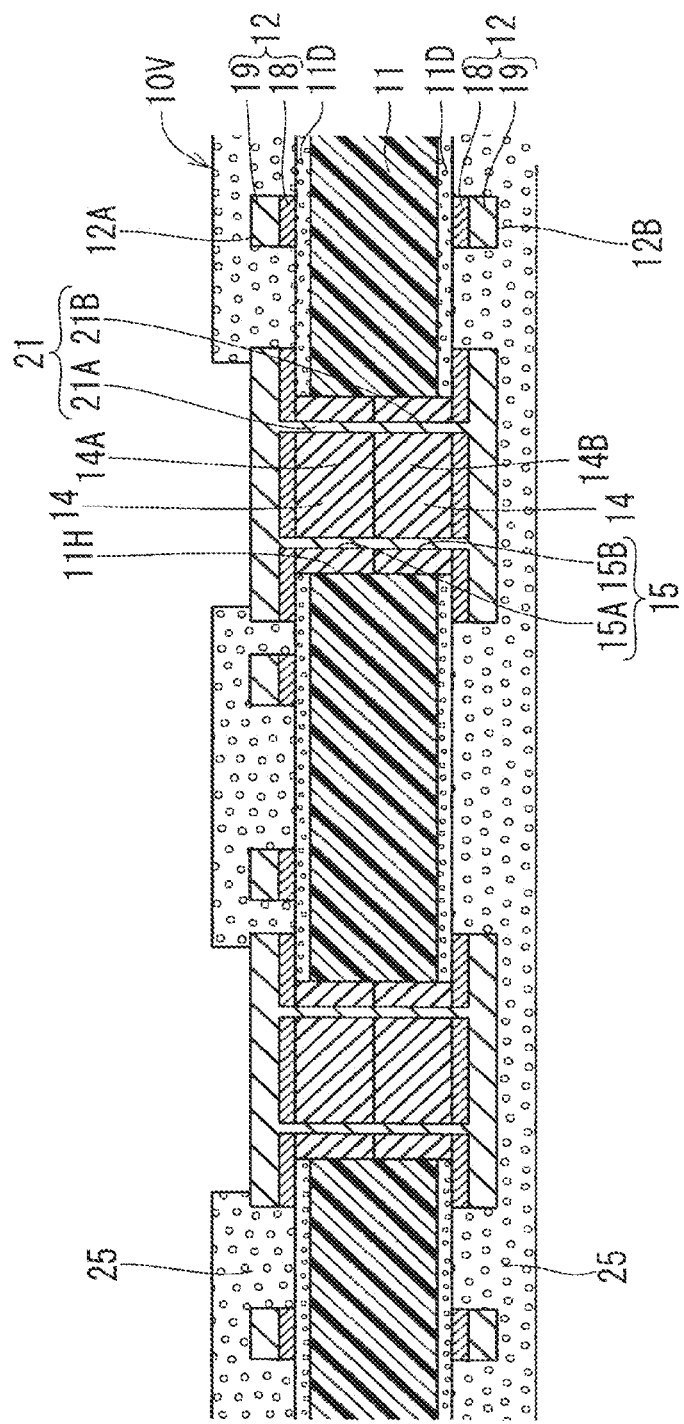
FIG. 9 is a cross-sectional side view of a wiring board according to a second embodiment.

A wiring board (10V) of a second embodiment illustrated in FIG. 9 is different from the first embodiment in that the plating posts 14 are provided on both the first conductor layer (12B) and the second conductor layer (12A). Hereinafter, the plating posts 14 that are provided on the first conductor layer (12B) are referred to as first plating posts (14B) as appropriate, and the plating posts 14 that are provided on the second conductor layer (12A) are referred to as second plating posts (14A) as appropriate.

The first plating posts (14B) and the second plating posts (14A) butt against each other in the insulating through holes (11H). Here, the term "butt against each other" refers to not only a case where front ends of the first plating posts (14B) and the second plating posts (14A) are in contact with each other, but also a case where there are slight gaps between the front ends. Further, in the wiring board (10V), continuous post through holes 15 are formed that penetrate all of the copper foil layer 18 of the first conductor layer (12B), the first plating posts (14B), the second plating posts (14A) and the copper foil layer 18 of the second conductor layer (12A), and continuous plating connection lines 21 (corresponding to "plating connecting parts" of the present invention) are provided that are formed by filling the continuous post through holes 15 with plating. Of the continuous post through holes 15, portions that penetrate the first plating posts (14B) correspond to first post through holes (15B) (corresponding to "first holes" of the present invention), and portions that penetrate the second plating posts (14A) correspond to second post through holes (15A) (corresponding to "second holes" of the present invention). Further, of the continuous plating connection lines 21, portions provided in the first post through holes (15B) are referred to as first plating connection lines (21B) as appropriate, and portions provided in the second post through holes (15A) are referred to as second plating connection lines (21A) as appropriate. Due to the continuous plating connection lines 21, the first plating posts (14B) and the second conductor layer (12A) are connected, and the second plating posts (14A) and the first conductor layer (12B) are connected.

The wiring board (10V) of the present embodiment is manufactured as follows.

(1) A substrate that is obtained by superposing a carrier-attached copper foil 33 on an F surface (50F), which is a front surface of a support substrate 50, and a substrate that is obtained by superposing a carrier-attached copper foil 33 on a B surface (50B), which is a back surface of a support substrate 50, are prepared. Plating posts (14, 14) are respectively formed on the copper foils (35, 35) of the carrier-attached copper foils (33, 33).

(2) An insulating substrate 11, in which insulating through holes (11H) are formed, and two bonding sheets (11D, 11D), in each of which through holes that overlaps with the insulating through holes (11H) are formed, are prepared. Then, the bonding sheet (11D), the insulating substrate 11, the bonding sheet (11D) and the copper foil 35 are stacked in this order, and are arranged between the two carrier-attached copper foils (33, 33).

(3) A hot pressing treatment is performed. As illustrated in FIG. 10A, the support substrates (50, 50), the carrier-attached copper foils (33, 33) and the insulating substrate 11 are integrated. As a result, the copper foils (35, 35) are bonded to the front and back sides of the insulating substrate 11, and the plating posts (14, 14) are press-fitted into the insulating through holes (11H) of the insulating substrate 11 without leaving any gaps. In this case, the front and back plating posts (14, 14) abut against each other.

(4) As illustrated in FIG. 10B, the support substrates 50 and the carriers 34 are peeled off.

(5) As illustrated in FIG. 11A, the continuous post through holes 15 that penetrate the front and back copper foils (35, 35) and the plating posts (14, 14) are formed using a tool such as a drill.

(6) An electroless plating treatment is performed. An electroless plating film (not illustrated in the drawings) is formed on the copper foils (35, 35) of the F surface (11F) side and the B surface (11B) side and in the continuous post through holes 15.

(7) An electrolytic plating treatment is performed. As illustrated in FIG. 11B, a copper plating film 38 (corresponding to a "metal plating film" of the present invention) is formed on the electroless plating film (not illustrated in the drawings). As a result, copper plating is performed on the copper foils (35, 35), and the continuous post through holes 15 are filled with copper plating.

(8) Processes same as the above-described processes (10)-(13) of the first embodiment are performed, and the wiring board (10V) illustrated in FIG. 9 is completed.

Description about the structure and the manufacturing method of the wiring board (10V) of the present embodiment is as given above. According to the wiring board (10V) of the present embodiment, both the conductor layers (12, 12) on extension lines of the insulating through holes (11H) have a two-layer structure that includes the copper foil layer 18 and the copper plating layer 19. Therefore, flatness of the front and back conductor layers (12, 12) can be improved.

Further, for example, by preparing multiple substrates that are each obtained by bonding the carrier-attached copper foils 33 to the front and back sides of the support substrate 50, and alternately arranging the multiple substrates and multiple insulating substrates 11 and subjecting them to a hot pressing treatment, multiple insulating substrates 11 to each of which the copper foils 35 are bonded can be obtained at once.

Other Embodiments

The present invention is not limited to the above-described embodiments. For example, embodiments described below are also included in the technical scope of the present invention. Further, in addition to the embodiments described below, various modifications can be made without departing from the spirit and scope of the present invention.

(1) In the above-described embodiments, one conductor layer 12 is formed on each of the front and back sides of the insulating substrate 11. However, multiple conductor layers 12 may be formed with an insulating resin layer interposed therebetween.

(2) In the above-described embodiments, the electronic component mounted on the pads 26 is the LED 80. However, it is also possible that the electronic component is a power semiconductor or the like.

Figure 12:
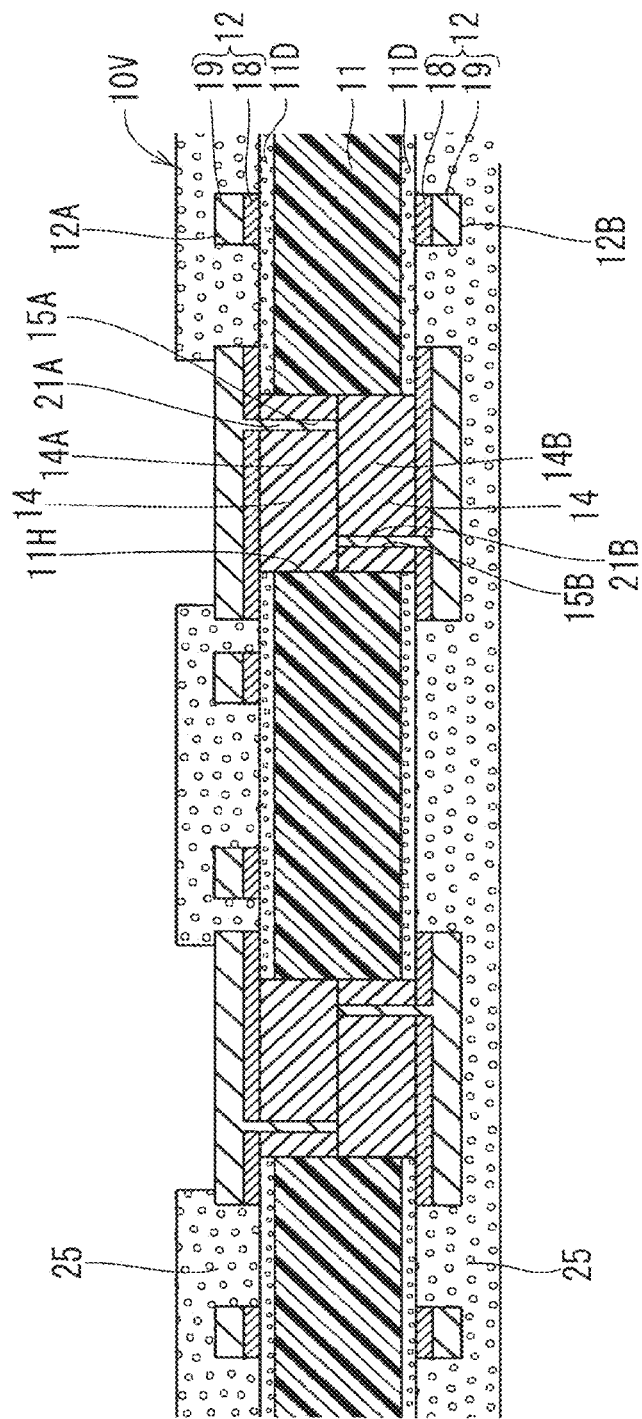
FIG. 12 is a cross-sectional side view of a wiring board according to a modified embodiment.

(3) In the above-described second embodiment, the continuous post through holes 15 that penetrate all of the first plating posts (14B) and the second plating posts (14A) are formed. However, as illustrated in FIG. 12, it is also possible that the first post through holes (15B) that penetrate the first plating posts (14B) and the second post through holes (15A) that penetrate the second plating posts (14A) are formed to be shifted from each other. In this case, the first plating connection lines (21B) and the second plating connection lines (21A) respectively correspond to "plating connecting parts" of the present invention.

Figure 13:
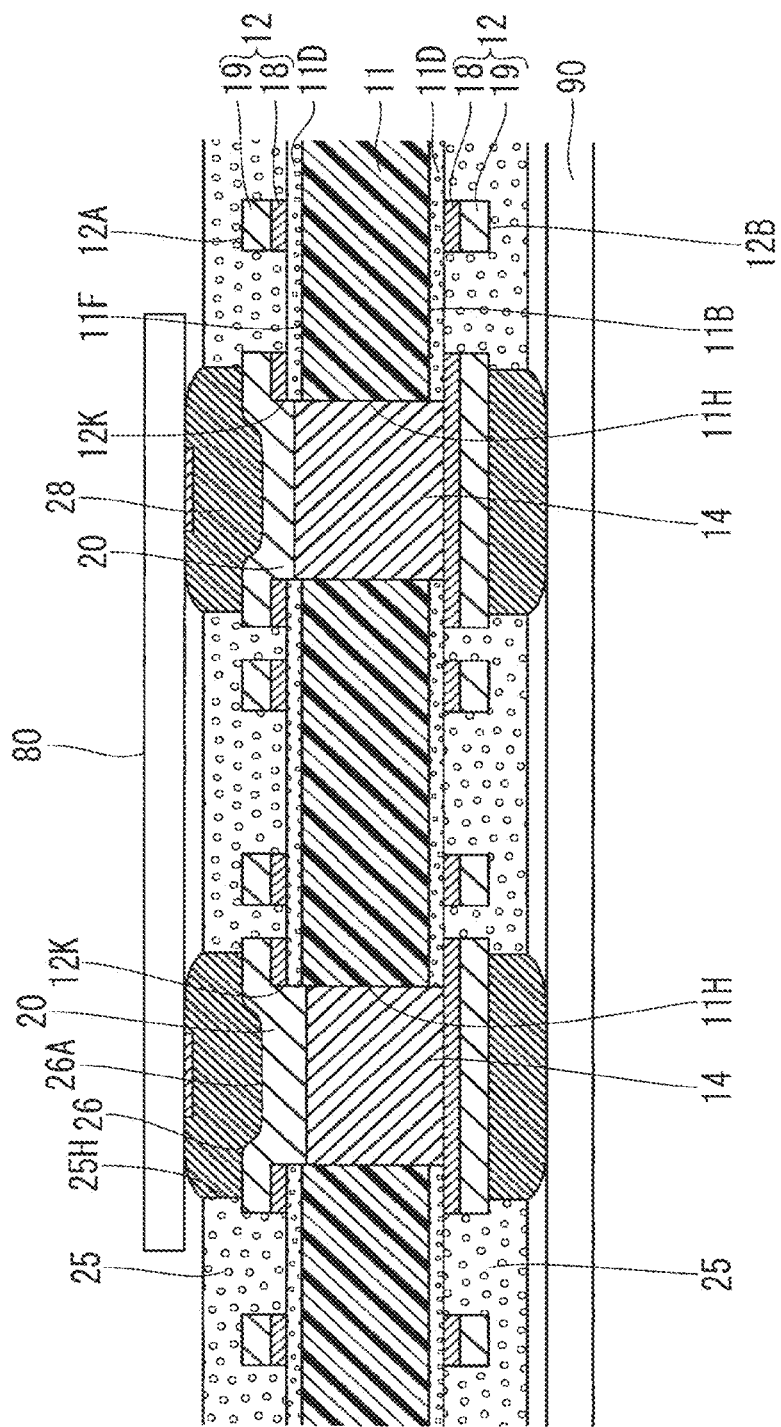
FIG. 13 is a cross-sectional side views illustrating an example of use of the wiring board according to the modified embodiment.

(4) In the above-described embodiments, pads 26 are not formed on the back side of the wiring board 10. However, as illustrated in FIG. 13, it is also possible that pads 26 are also formed on the back side and, for example, are connected to a metal plate 90. In this case, heat from the plating posts 14 is released to the metal plate 90. Therefore, heat from the LED 80 can be more efficiently released.

(5) It is also possible that the pads 26 of the wiring board 10 and the LED 80 are connected by wire bonding.

(6) In the above-described embodiments, the plating posts 14 are made of copper. However, the present invention is not limited to this. For example, it is also possible that the plating posts 14 are made of silver, a mixture of copper and molybdenum or tungsten, aluminum or the like.

(7) In the above-described embodiments, front end surfaces of the plating posts 14 are positioned inside the insulating through holes (11H). However, it is also possible that the front end surfaces of the plating posts 14 are flush with the upper surface of the insulating substrate 11.

A wiring board may have metal members that connect to electronic component mounting parts of a conductor layer are accommodated in through holes of an insulating substrate. In this wiring board, a mold is used in accommodating the metal members in the through holes of the insulating substrate.

For example, when several types of metal members having different sizes are prototyped, a mold is prepared each time the metal members are prototyped and thus there may be a problem that the cost is increased.

A wiring board according to an embodiment of the present invention includes: an insulating substrate; a first conductor layer that is laminated on one of a front side and a back side of the substrate; a second conductor layer that is laminated on the other side of the substrate; through holes that are formed in the substrate; first plating posts that project from the first conductor layer and are fitted in the through holes; plating connecting parts that connect the second conductor layer and the first plating posts; and an electronic component mounting part for mounting an electronic component. The one electronic component mounting part for mounting the one electronic component has multiple electronic component connecting parts in the first conductor layer or the second conductor layer, the multiple electronic component connecting parts being respectively positioned on the multiple through holes and connecting to the electronic component. The multiple first plating posts and the multiple plating connecting parts are respectively connected to each other.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring board, comprising:
an insulating substrate;
a first conductor layer laminated on a first side of the insulating substrate;
a second conductor layer laminated on a second side of the insulating substrate;
a plurality of first plating posts fitted in a plurality of through holes in the insulating substrate respectively such that the plurality of first plating posts is projecting from the first conductor layer;
a plurality of plating connecting parts connecting the second conductor layer and the first plating posts and having a plurality of electronic component connecting portions such that the plurality of electronic component connecting portions forms an electronic component mounting part positioned to mount an electronic component and is positioned on the plurality of through holes, respectively; and
a plurality of second plating posts fitted in the plurality of through holes in the insulating substrate respectively such that the plurality of second plating posts is projecting from the second conductor layer and abutting against the plurality of first plating posts, respectively,
wherein the plurality of second plating posts has a plurality of second holes formed such that the plurality of second holes is penetrating through the plurality of second plating posts in a thickness direction of the insulating substrate respectively, and the plurality of plating connecting parts is formed inside the plurality of second holes, respectively.

2. A wiring board according to claim 1, wherein the plurality of plating connecting parts is formed such that the plurality of plating connecting parts is connecting the second conductor layer and end portions of the first plating posts, respectively.

3. A wiring board according to claim 2, wherein the second conductor layer comprises a metal foil and a metal plating layer formed on the metal foil, and the plurality of plating connecting parts and the metal plating layer comprise same plating material such that the plurality of plating connecting parts and the metal plating layer form an integral structure.

4. A wiring board according to claim 1, wherein the plurality of first plating posts has a plurality of first holes formed such that the plurality of first holes is penetrating through the plurality of first plating posts on extension lines of the plurality of second holes respectively, and the plurality of plating connecting parts is formed inside the plurality of first holes and the plurality of second holes, respectively.

5. A wiring board according to claim 1, wherein the insulating substrate has plasticity.

6. A wiring board according to claim 1, wherein the second conductor layer comprises a metal foil and a metal plating layer formed on the metal foil, and the plurality of plating connecting parts and the metal plating layer comprise same plating material such that the plurality of plating connecting parts and the metal plating layer form an integral structure.

7. A wiring board according to claim 4, wherein the second conductor layer comprises a metal foil and a metal plating layer formed on the metal foil, and the plurality of plating connecting parts and the metal plating layer comprise same plating material such that the plurality of plating connecting parts and the metal plating layer form an integral structure.

8. A wiring board according to claim 5, wherein the second conductor layer comprises a metal foil and a metal plating layer formed on the metal foil, and the plurality of plating connecting parts and the metal plating layer comprise same plating material such that the plurality of plating connecting parts and the metal plating layer form an integral structure.

9. A wiring board according to claim 2, wherein the insulating substrate has plasticity.

10. A wiring board according to claim 4, wherein the insulating substrate has plasticity.

11. A method for manufacturing a wiring board, comprising:
forming a plurality of through holes in an insulating substrate;
forming a plurality of first plating posts on a metal foil such that the plurality of first plating posts is projecting from the metal foil;
laminating the metal foil on a first side of the insulating substrate such that the plurality of first plating posts is fitted and accommodated in the plurality of through holes in the insulating substrate respectively;
forming a first conductor layer comprising the metal foil such that the first conductor layer is formed on the first side of the insulating substrate;
forming a plurality of second plating posts on a metal foil for a second side of the insulating substrate;
laminating the metal foil for the second side on the second side of the insulating substrate such that the plurality of second plating posts is fitted and accommodated in the plurality of through holes in the insulating substrate respectively;
forming a second conductor layer comprising the metal foil on the second side of the insulating substrate such that the second conductor layer is formed on the second side of the insulating substrate;
forming a plurality of second holes in the plurality of second plating posts respectively such that the plurality of second holes is penetrating through the plurality of second plating posts in a thickness direction of the insulating substrate respectively; and
applying plating inside the plurality of second holes such that a plurality of plating connecting parts connecting the second conductor layer and the first plating posts is formed, respectively.

12. A method for manufacturing a wiring board according to claim 11, further comprising:
forming a plurality of through holes in the metal foil of the second conductor layer,
wherein the applying of plating comprises applying plating inside the plurality of through holes in the metal foil of the second conductor layer such that the plurality of plating connecting parts connecting the second conductor layer and the first plating posts is formed.

13. A method for manufacturing a wiring board according to claim 11, wherein the applying of plating comprises applying plating on the metal foil of the second conductor layer such that a metal plating film is laminated on the metal foil of the second conductor layer, and the second conductor layer comprising the metal plating film and the metal foil on the second side of the insulating layer is formed by etching the metal plating film and the metal foil on the second side of the insulating layer.

14. A method for manufacturing a wiring board according to claim 11, further comprising:
forming a plurality of first holes in the plurality of first plating posts such that the plurality of first holes is penetrating through the plurality of first plating posts on extension lines of the plurality of second holes respectively; and
applying plating inside the plurality of first holes such that the plurality of plating connecting parts is formed, respectively.

15. A method for manufacturing a wiring board according to claim 11, wherein the insulating substrate comprises a material having plasticity.

16. A method for manufacturing a wiring board according to claim 11, wherein the applying of plating comprises applying plating such that the plurality of plating connecting parts has a plurality of electronic component connecting portions that forms an electronic component mounting part positioned to mount an electronic component and is positioned on the plurality of through holes, respectively.

17. A method for manufacturing a wiring board according to claim 12, wherein the applying of plating comprises applying plating on the metal foil of the second conductor layer such that a metal plating film is laminated on the metal foil of the second conductor layer, and the second conductor layer comprising the metal plating film and the metal foil on the second side of the insulating layer is formed by etching the metal plating film and the metal foil on the second side of the insulating layer.

18. A method for manufacturing a wiring board according to claim 14, wherein the applying of plating comprises applying plating on the metal foil of the second conductor layer such that a metal plating film is laminated on the metal foil of the second conductor layer, and the second conductor layer comprising the metal plating film and the metal foil on the second side of the insulating layer is formed by etching the metal plating film and the metal foil on the second side of the insulating layer.

19. A method for manufacturing a wiring board according to claim 15, wherein the applying of plating comprises applying plating on the metal foil of the second conductor layer such that a metal plating film is laminated on the metal foil of the second conductor layer, and the second conductor layer comprising the metal plating film and the metal foil on the second side of the insulating layer is formed by etching the metal plating film and the metal foil on the second side of the insulating layer.

20. A method for manufacturing a wiring board according to claim 16, wherein the applying of plating comprises applying plating on the metal foil of the second conductor layer such that a metal plating film is laminated on the metal foil of the second conductor layer, and the second conductor layer comprising the metal plating film and the metal foil on the second side of the insulating layer is formed by etching the metal plating film and the metal foil on the second side of the insulating layer.

* * * * *